(12) United States Patent
Kim et al.

(10) Patent No.: US 10,831,049 B2
(45) Date of Patent: Nov. 10, 2020

(54) FLEXIBLE DISPLAY DEVICE

(71) Applicant: LG Display Co., Ltd., Seoul (KR)

(72) Inventors: Da-Young Kim, Paju-si (KR); Won-Jeong Shin, Paju-si (KR); Won-Gyu Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/208,977

(22) Filed: Dec. 4, 2018

(65) Prior Publication Data
US 2019/0171057 A1 Jun. 6, 2019

(30) Foreign Application Priority Data

Dec. 5, 2017 (KR) .................. 10-2017-0165800

(51) Int. Cl.
*G02F 1/1333* (2006.01)
*G02F 1/1368* (2006.01)
(Continued)

(52) U.S. Cl.
CPC ...... *G02F 1/133305* (2013.01); *G02F 1/1368* (2013.01); *G02F 1/133308* (2013.01);
(Continued)

(58) Field of Classification Search
CPC ......... G02F 1/133305; G02F 1/136286; G02F 1/1368; G02F 1/133308; G02F 2001/133314; G02F 1/1333; G02F 1/136277; G02F 2001/133302; G02F 2001/133368; G02F 2001/133354; G02F 2201/56; G02F 1/133608; G02F 2001/133311; G02F 2001/133317; G02F 2001/13332; G02F 2001/133322; G02F 2001/133325; G02F 2001/133328; G02F 2001/133331; G02F 2001/133334; H01L 51/0097; H01L 2251/5338; H01L 23/48; H01L 23/49572; H01L 2224/50;
(Continued)

(56) References Cited

U.S. PATENT DOCUMENTS 8,294,869 B2 10/2012 Yamaguchi et al.
2010/0073620 A1* 3/2010 Yamaguchi ....... G02F 1/133305
349/160
(Continued)

FOREIGN PATENT DOCUMENTS

CN 103681759 A 3/2014
CN 103927941 A 7/2014
(Continued)

OTHER PUBLICATIONS

First Office Action dated Sep. 16, 2020, issued in corresponding Chinese Patent Application No. 2018114065334.

*Primary Examiner* — Shan Liu
(74) *Attorney, Agent, or Firm* — Morgan, Lewis & Bockius LLP

(57) ABSTRACT

A flexible display device is disclosed. The disclosed flexible display device includes a display panel configured to display an image; and a back film under the display panel. The back film includes a plurality of depressed patterns at a surface adjacent to the display panel. The plurality of depressed patterns are spaced apart from each other and extend in a direction away from a center of the back film.

9 Claims, 8 Drawing Sheets

(51) Int. Cl.
*G02F 1/1362* (2006.01)
*H01L 51/00* (2006.01)

(52) U.S. Cl.
CPC .... *G02F 1/136286* (2013.01); *H01L 51/0097* (2013.01); *G02F 2001/133314* (2013.01); *H01L 2251/5338* (2013.01)

(58) Field of Classification Search
CPC ............ H01L 2224/79; H01L 2224/86; H01L 2225/06579; H01L 2225/107; H01L 24/50; H01L 27/12; H01L 27/1203; H01L 27/1218; H01L 21/02367
USPC ..................... 349/150, 158, 58–60
See application file for complete search history.

(56) References Cited

U.S. PATENT DOCUMENTS

| | | | |
|---|---|---|---|
| 2011/0152604 A1* | 6/2011 | Hull, Jr. ................. | A61F 2/005 600/29 |
| 2013/0261202 A1* | 10/2013 | Cao ................... | C08G 73/1046 521/154 |
| 2014/0077181 A1 | 3/2014 | Kim | |
| 2015/0181731 A1 | 6/2015 | Lin et al. | |
| 2015/0251387 A1* | 9/2015 | Arakawa ................... | B32B 5/26 442/181 |
| 2015/0314561 A1 | 11/2015 | Kim et al. | |
| 2016/0357052 A1* | 12/2016 | Kim .................... | H01L 51/5237 |
| 2017/0040392 A1 | 2/2017 | Wang et al. | |
| 2017/0092884 A1* | 3/2017 | Zhang ................ | H01L 51/0097 |
| 2017/0155084 A1* | 6/2017 | Park .................... | H01L 51/0097 |
| 2017/0263890 A1* | 9/2017 | Chun .................... | H01L 51/524 |
| 2018/0035554 A1 | 2/2018 | Liu et al. | |
| 2019/0357647 A1* | 11/2019 | Kilmer .................. | A45C 11/00 |

FOREIGN PATENT DOCUMENTS

| | | |
|---|---|---|
| CN | 104134660 A | 11/2014 |
| CN | 104204095 A | 12/2014 |
| CN | 104733507 A | 6/2015 |
| CN | 105609006 A | 5/2016 |
| CN | 107067975 A | 8/2017 |
| CN | 206400960 U | 8/2017 |
| CN | 107180849 A | 9/2017 |

* cited by examiner

FLEXIBLE DISPLAY DEVICE

The present application claims priority from and the benefit of Korean Patent Application No. 10-2017-0165800 filed on Dec. 5, 2017, which is hereby incorporated by reference in its entirety for all purposes as if fully set forth herein.

BACKGROUND

Technical Field

The present disclosure relates to a flexible display device, and more particularly, to a back film improving flexibility and a flexible display device including the same.

Discussion of the Related Art

With the rapid development of information technologies, display devices for displaying large amounts of information are being developed. Recently, flat panel display devices having a thin profile, light weight, and low power consumption, such as liquid crystal display devices or electroluminescent display devices, have been suggested and widely applied.

A type of flat panel display device is a liquid crystal display device, which includes a liquid crystal panel. The liquid crystal panel includes an upper substrate and a lower substrate attached to each other with a liquid crystal layer having liquid crystal molecules interposed therebetween as an essential component. Liquid crystal molecules of the liquid crystal layer are driven by an electric field generated between a pixel electrode and a common electrode. This process displays an image.

Another type of flat panel display device is an electroluminescent display device, which includes a light-emitting diode. The light-emitting diode includes an anode and a cathode opposite each other with a light-emitting layer interposed therebetween as an essential component. Holes and electrons respectively injected from the anode and the cathode are combined in the light-emitting layer to thereby emit light and display an image.

Recently, a demand for a flexible display device using a flexible substrate has increased. Because the flexible display device may be carried in a folded state and display an image in an unfolded state, it has the advantages of a large screen and easy portability.

In the flexible display device, because a rear surface of a flexible substrate is exposed to various scratches and contamination, a back film is attached to the rear surface of the flexible substrate to protect the flexible substrate from the external environment.

However, the flexible substrate in the related art is very thin, and thus the back film also serves to support the flexible substrate. To support the flexible substrate, the back film needs to have a certain thickness or more, and this lowers the flexibility of the flexible display device. Accordingly, it is not easy to bend or fold the flexible display device.

On the other hand, when using a back film having a relatively high flexibility to improve the flexibility of the flexible display device, a different problem exists. In that case, the force required to support the flexible substrate is lowered and thus, the flexible display device is not easy to handle.

SUMMARY

Accordingly, example embodiments of the present disclosure are directed to a flexible substrate and a flexible display device that substantially obviate one or more of these problems due to limitations and disadvantages of the related art.

An aspect of the present disclosure is to provide a flexible display device with improved flexibility. The flexible display device may increase a force of supporting a display panel within the flexible display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof, as well as the appended drawings.

To achieve these and other advantages, and in accordance with the purpose of the present invention, as embodied and broadly described herein, a flexible display device includes: a display panel configured to display an image; and a back film under the display panel, wherein the back film includes a plurality of depressed patterns at a surface adjacent to the display panel, and wherein the plurality of depressed patterns are spaced apart from each other and extend in a direction away from a center of the back film.

It is to be understood that both the foregoing general description and the following detailed description are by example and explanatory, and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this specification, illustrate example embodiments of the present disclosure and together with the description serve to explain various principles of the present disclosure. In the drawings.

DETAILED DESCRIPTION

Reference will now be made in detail to example embodiments of the present disclosure, examples of which may be illustrated in the accompanying drawings.

Figure 1:
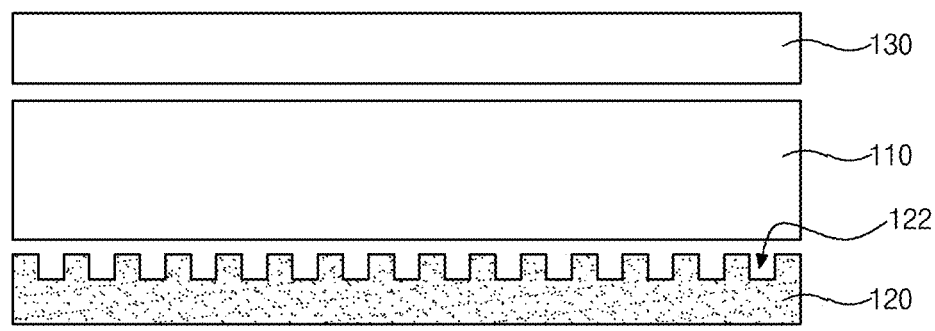
FIG. 1 is a cross-sectional view of a flexible display device according to an example embodiment of the present disclosure.
Figure 2A:
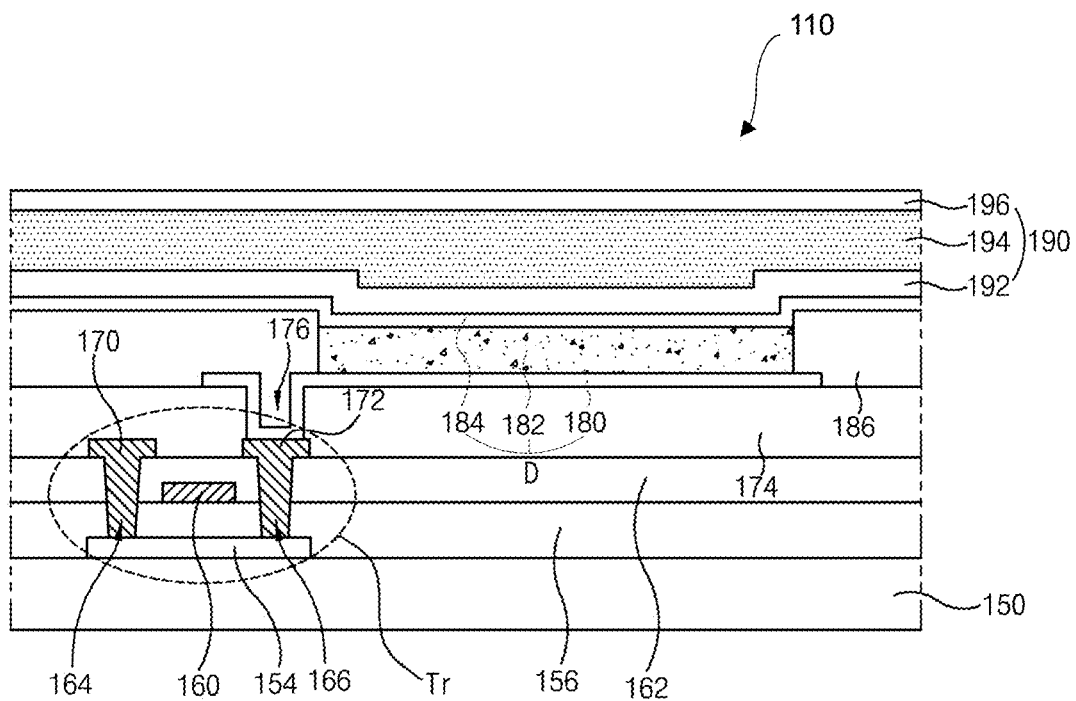
FIGS. 2A and 2B are cross-sectional views showing examples of a display panel for a flexible display device according to an example embodiment of the present disclosure.
Figure 2B:
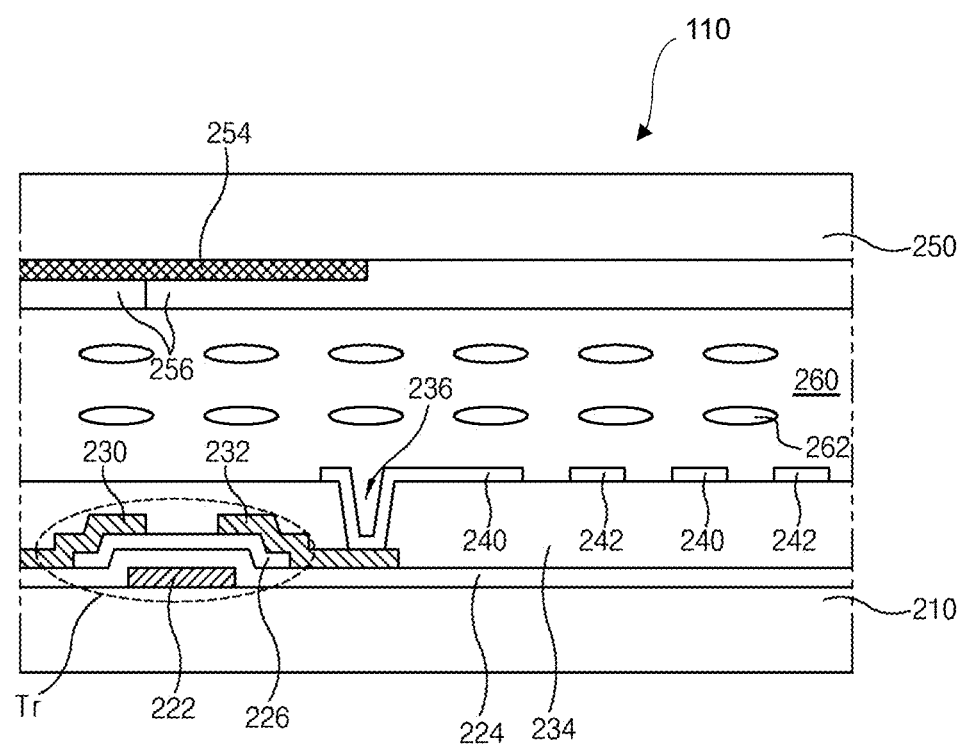

FIG. 1 is a cross-sectional view of a flexible display device according to an example embodiment of the present disclosure. FIGS. 2A and 2B are cross-sectional views showing examples of a display panel for a flexible display device according to an example embodiment of the present disclosure and also show a pixel region.

In FIG. 1, the flexible display device includes a display panel 110, a back film 120 under the display panel 110, and a cover window 130 over the display panel 110.

As illustrated in FIG. 2A, in an example embodiment, the display panel 110 may be an electroluminescent display panel. The display panel 110 may include a flexible substrate 150, a thin film transistor Tr disposed on the flexible substrate 150, a light emitting diode D connected to the thin film transistor Tr, and an encapsulation film 190 covering the light emitting diode D.

A semiconductor layer 154 may be formed on the flexible substrate 150. A buffer layer (not shown in FIG. 2A) may be formed between the flexible substrate 150 and the semiconductor layer 154. The buffer layer may be formed of an inorganic insulating material such as silicon oxide ($SiO_2$) and/or silicon nitride (SiNx) and may have a multi-layer structure.

The flexible substrate 150 may be formed of plastic having relatively high thermal stability. For example, the flexible substrate 150 may include polyimide. In some example embodiments, the semiconductor layer 154 may be formed of an oxide semiconductor material and/or polycrystalline silicon. When the semiconductor layer 154 is formed of an oxide semiconductor material, a light-blocking pattern (not shown in FIG. 2A) may be formed under the semiconductor layer 154. The light-blocking pattern blocks light from being incident on the semiconductor layer 154, thereby preventing or reducing the semiconductor layer 154 from being degraded by the light. In other example embodiments, the semiconductor layer 154 may be formed of polycrystalline silicon, and impurities may be doped in both side portions of the semiconductor layer 154.

A gate insulation layer 156 of an insulating material may be formed on the semiconductor layer 154. The gate insulation layer 156 may be formed of an inorganic insulating material such as silicon oxide ($SiO_2$) and/or silicon nitride (SiNx).

A gate electrode 160 of a conductive material, such as metal, may be formed on the gate insulation layer 156 to correspond to a substantially central portion of the semiconductor layer 154.

In FIG. 2A, the gate insulation layer 156 may be formed over substantially all of the flexible substrate 150. In some example embodiments, the gate insulation layer 156 may be patterned to have the same or a substantially similar shape as the gate electrode 160.

An interlayer insulation layer 162 of an insulating material may be formed on the gate electrode 160. The interlayer insulation layer 162 may be formed over substantially all of the flexible substrate 150. The interlayer insulation layer 162 may be formed of an inorganic insulating material such as silicon oxide ($SiO_2$) and/or silicon nitride (SiNx) and/or an organic insulating material such as benzocyclobutene and/or photo acryl.

The interlayer insulation layer 162 may include first and second contact holes 164 and 166 that may expose top surfaces of both side portions of the semiconductor layer 154, respectively. The first and second contact holes 164 and 166 may be spaced apart from the gate electrode 160, and the gate electrode 160 may be disposed between the first and second contact holes 164 and 166. The first and second contact holes 164 and 166 may also be formed in the gate insulation layer 156. In some example embodiments, when the gate insulation layer 156 is patterned to have the same or a substantially similar shape as the gate electrode 160, the first and second contact holes 164 and 166 may be formed only in the interlayer insulation layer 162.

A source electrode 170 and a drain electrode 172 of a conductive material such as metal may be formed on the interlayer insulation layer 162. The source and drain electrodes 170 and 172 may be spaced apart from each other with respect to the gate electrode 160. The source and drain electrodes 170 and 172 may contact both side portions of the semiconductor layer 154 through the first and second contact holes 164 and 166, respectively.

The semiconductor layer 154, the gate electrode 160, the source electrode 170, and the drain electrode 172 may constitute the thin film transistor Tr. The thin film transistor Tr may function as a driving element. In some example embodiments, the thin film transistor Tr may have a coplanar structure where the gate electrode 160 and the source and drain electrodes 170 and 172 may be disposed over the semiconductor layer 154. In other example embodiments, the thin film transistor Tr may have an inverted staggered structure where the gate electrode is disposed under the semiconductor layer and the source and drain electrodes are disposed over the semiconductor layer. In this instance, the semiconductor layer may be formed of amorphous silicon.

Although not shown in FIG. 2A, a gate line and a data line may cross each other to define a pixel region, and a switching element connected to the gate line and the data line may be formed. The switching element may also be connected to the thin film transistor Tr of the driving element. The switching element may have the same structure as the thin film transistor Tr. In addition, a power line may be further formed in parallel to and spaced apart from the gate line or the data line, and a storage capacitor may be further formed to constantly maintain a voltage at the gate electrode of the thin film transistor Tr during one frame.

A passivation layer 174 may be formed to cover the thin film transistor Tr and may have a drain contact hole 176 exposing the drain electrode 172. A first electrode 180 may be formed on the passivation layer 174 and may be connected to the drain electrode 172 of the thin film transistor Tr through the drain contact hole 176. The first electrode 180 may be separately disposed in each pixel region. The first electrode 180 may be an anode and may be formed of a conductive material having a relatively high work function. For example, the first electrode 180 may be formed of a transparent conductive material, such as indium tin oxide (ITO) and/or indium zinc oxide (IZO).

In some example embodiments, the display panel 110 of the present disclosure may be a top emission type electroluminescent display panel where light emitted from a light emitting layer is outputted to the outside through a second electrode opposite the first electrode 180. A reflection electrode or reflection layer may be further formed under the first electrode 180. For example, the reflection electrode or reflection layer may be formed of aluminum-palladium-copper (APC) alloy.

A bank layer 186 may be formed on the first electrode 180 and the passivation layer 174. The bank layer 186 may cover edges of the first electrode 180. The bank layer 186 may expose a substantially central portion of the first electrode 180 corresponding to the pixel region.

A light emitting layer 182 may be formed on the first electrode 180 exposed by the bank layer 186. In some example embodiments, the light emitting layer 182 may have a single-layer structure of a light emitting material layer. In other example embodiments, to increase luminous efficiency, the light emitting layer 182 may have a multi-layer structure and may include a hole injection layer, a hole transporting layer, a light emitting material layer, an electron transporting layer, and/or an electron injecting layer sequentially laminated on the first electrode 180. A light emitting material of the light emitting material layer may be an organic light emitting material or an inorganic light emitting material such as quantum dots.

A second electrode 184 may be formed over the flexible substrate 150 on which the light emitting layer 182 is formed. The second electrode 184 may be formed over substantially all of a display area. The second electrode 184 may be formed of a conductive material having relatively low work function and may serve as a cathode. For example, the second electrode 184 may be formed of aluminum (Al), magnesium (Mg), and/or their respective alloys, but the second electrode 184 is not limited thereto.

The first electrode 180, the light emitting layer 182 and the second electrode 184 constitute the light emitting diode D.

The encapsulation film 190 may be formed on the second electrode 184 to prevent moisture of the outside from permeating the light emitting diode D. The encapsulation film 190 may include a first inorganic insulation layer 192, an organic insulation layer 194, and a second inorganic insulation layer 196, but the encapsulation film 190 is not limited thereto.

In some example embodiments, when the display panel 110 of the present disclosure is a top emission type electroluminescent display panel, a polarizer (not shown in FIG. 2A) may be attached to the encapsulation film 190 to reduce reflection of external light. For example, the polarizer may be a circular polarizer.

As illustrated in FIG. 2B, in an example embodiment, the display panel 110 of the present disclosure may be a liquid crystal display panel. The display panel 110 may include first and second flexible substrates 210 and 250 facing each other and a liquid crystal layer 260 interposed between the first and second flexible substrates 210 and 250. The liquid crystal layer 260 may include liquid crystal molecules 262.

The first and second flexible substrates 210 and 250 may be formed of plastic having relatively high thermal stability. For example, the first and second flexible substrates 210 and 250 may include polyimide.

A thin film transistor Tr may be formed on an inner surface of the first flexible substrate 210. For example, a gate electrode 222 may be formed on the first flexible substrate 210, and a gate insulation layer 224 may be formed to cover the gate electrode 222. Also, a gate line (not shown in FIG. 2B) connected to the gate electrode 222 may be formed on the first flexible substrate 210.

Although not shown in FIG. 2B, a buffer layer may be further formed on the first flexible substrate 210 and the gate electrode 222. The buffer layer may be formed of an inorganic insulating material, such as silicon oxide ($SiO_2$) and/or silicon nitride (SiNx), and may have a multi-layer structure.

A semiconductor layer 226 may be formed on the gate insulation layer 224 to correspond to the gate electrode 222. In some example embodiments, the semiconductor layer 226 may be formed of an oxide semiconductor material. In other example embodiments, the semiconductor layer 226 may include an active layer of intrinsic amorphous silicon and/or ohmic contact layers of impurity-doped amorphous silicon.

Source and drain electrodes 230 and 232 may be formed on the semiconductor layer 226 and may be spaced apart from each other. In addition, a data line (not shown in FIG. 2B) connected to the source electrode 230 may be formed on the gate insulation layer 224 and may cross the gate line to thereby define a pixel region.

The gate electrode 222, the semiconductor layer 226, the source electrode 230, and the drain electrode 232 may constitute a thin film transistor Tr. A passivation layer 234 may be formed on the thin film transistor Tr. The passivation layer 234 has a drain contact hole 236 exposing the drain electrode 232.

A pixel electrode 240 and a common electrode 242 may be formed on the passivation layer 234. Parts of the pixel electrode 240 and parts of the common electrode 242 may alternate each other. The pixel electrode 240 may be connected to the drain electrode 232 through the drain contact hole 236.

A black matrix 254 may be formed on an inner surface of the second flexible substrate 250. The black matrix 254 may shield a non-display area such as the thin film transistor Tr, the gate line, and/or the data line. A color filter layer 256 may be formed on the second flexible substrate 250 to correspond to the pixel region, in which case, the black matrix 254 may be omitted. Although not shown in FIG. 2B, a buffer layer may be further formed between the second flexible substrate 250 and the black matrix 254.

The first and second flexible substrates 210 and 250 may be attached to each other with the liquid crystal layer 260 interposed therebetween. The liquid crystal molecules 262 of the liquid crystal layer 260 may be driven by an electric field generated between the pixel electrode 240 and the common electrode 242. The pixel electrode 240, the common electrode 242, and the liquid crystal layer 260 may constitute a liquid crystal capacitor, and the liquid crystal capacitor may be connected to the thin film transistor Tr.

Although not shown in FIG. 2B, an alignment layer may be formed on each of the first and second flexible substrates 210 and 250 adjacent to the liquid crystal layer 260. Further, first and second polarizers having light transmission axes perpendicular to each other may be attached on outer surfaces of the first and second flexible substrates 210 and 250, respectively. A flexible type backlight unit may be disposed under the first flexible substrate 210 to provide light.

In some example embodiments, the common electrode 242 may be formed on the first flexible substrate 210 and may include parts alternating with parts of the pixel electrode 240. In other example embodiments, the common electrode may be formed on an entire or substantially entire surface of the second flexible substrate 250, and the pixel electrode may be formed on the first flexible substrate 210 to have a plate shape corresponding to the pixel region.

With reference to FIG. 1, the back film 120 may be disposed under the display panel 110 and may support the display panel 110. Further, the back film 120 may protect the flexible substrate of the display panel 110 from scratches and/or contamination. For example, the back film 120 may be attached to the display panel 110 through an adhesive layer (not shown in FIG. 1). Such a back film 120 may include a plurality of depressed patterns at a surface adjacent to the display panel 110. A total area of the plurality of depressed patterns 122 may be about 30% to 50% of the area of the back film 120. A total area of portions of the back film 120 contacting the display panel 110 may be about 50% to 70% of the area of the back film 120.

If the total area of the plurality of depressed patterns 122 is larger than 50% of the area of the back film 120, a contact area may be disposed between the display panel 110 and the back film 120. In this example, the elongation of the back film 120 may increase, but the modulus of the back film 120 may considerably decrease. Thus, a support force to the display panel 110 may be lowered. On the other hand, if the total area of the plurality of depressed patterns 122 is smaller than 30% of the area of the back film 120, an increase in the elongation of the back film 120 may not be so large and it may be difficult to improve flexibility of the flexible display device.

The elongation of the back film 120 of the present disclosure may increase about three times to five times as compared with the related art back film without depressed patterns, while the back film 120 of the present disclosure may have a modulus similar to that of the related art back film. For example, the related art back film may have an elongation of about 2% to 3% and a modulus of about 3.4 GPa to 4 GPa. On the other hand, the back film 120 of the present disclosure may have an elongation of 6% to 15% (for example, 11% to 15%) and may have a modulus of about 3.5 GPa to 3.9 GPa.

A depth of each depressed pattern 122 may be about 0.4 to 0.6 times a thickness of the back film 120. For example, the back film 120 may have a thickness of about 120 m, and the depth of each depressed pattern 122 may be about 50 μm to 70 μm. However, the present disclosure is not limited thereto.

The back film 120 may be formed of polyethylene terephthalate (PET), transparent polyimide (PI), polyethylene naphthalate (PEN), cyclic olefin copolymer (COC), polyetherimide (PEI), or polyamide-imide (PAI). However, the present disclosure is not limited thereto.

The cover window 130 may be disposed over the display panel 110. For example, the cover window 130 may be formed of transparent plastic, and may be attached to the display panel 110 through an adhesive layer (not shown in FIG. 1).

In the flexible display device of the present disclosure, because the back film 120 may include the plurality of depressed patterns 122 at the surface adjacent to the display panel 110, the flexibility may be improved while the modulus is not lowered. The back film according to the example embodiment of the present disclosure will be described in detail with reference to accompanying drawings.

Figure 3A:
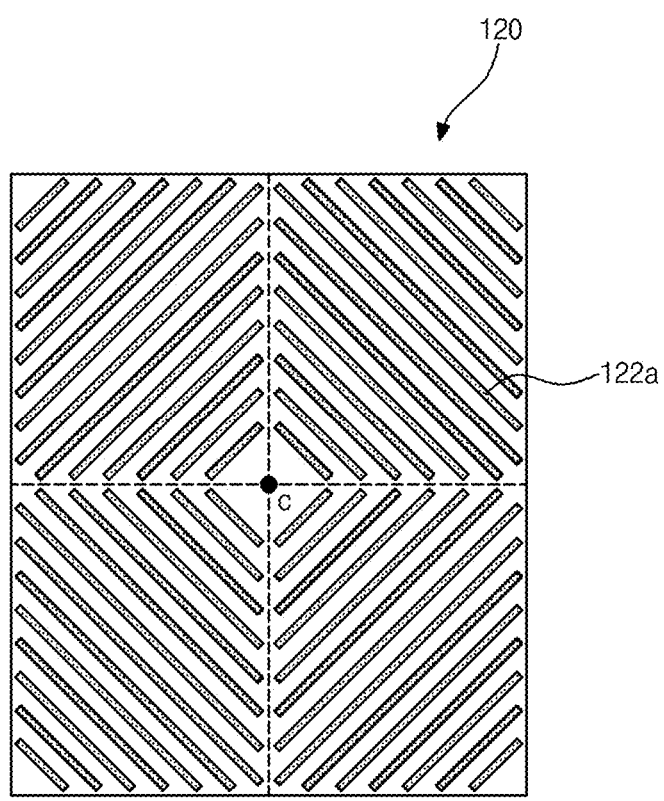
FIGS. 3A and 3B are plan views of a back film according to a first example embodiment of the present disclosure.
Figure 3B:
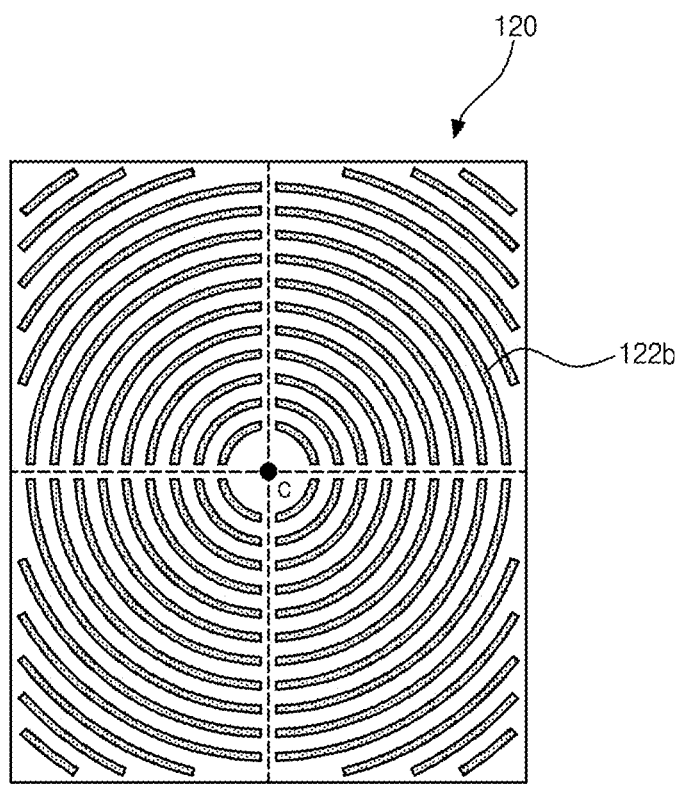

FIGS. 3A and 3B are plan views of a back film according to an example embodiment of the present disclosure. As illustrated in FIGS. 3A and 3B, the back film 120 may include a plurality of depressed patterns 122a and 122b at a surface thereof. The plurality of depressed patterns 122a and 122b may be spaced apart from each other in a direction away from a center C of the back film 120. As illustrated in FIGS. 3A and 3B, in some example embodiments, the back film 120 may have a rectangular shape and lengths of the plurality of depressed patterns 122a and 122b may increase and then decrease as a distance from the center C of the back film 120 increases. In other example embodiments, the back film 120 may have a circular shape and lengths of the plurality of depressed patterns 122a and 122b may increase as the distance from the center C of the back film 120 increases.

The elongation of the back film 120 may be about 11% to 15%, and the modulus may be about 3.5 GPa to 3.9 GPa. The plurality of depressed patterns 122a and 122b may have the same or a substantially similar width, and spaces between the plurality of depressed patterns 122a and 122b may be the same or substantially similar.

In some example embodiments, the plurality of depressed patterns 122a and 122b may have the same or a substantially similar width, and the space between the depressed patterns 122a and 122b close to the center C of the back film may be smaller than the space between the depressed patterns 122a and 122b far from the center C of the back film 120. The spaces between the plurality of depressed patterns 122a and 122b may increase with distance from the center C of the back film 120.

In some example embodiments, the spaces between the plurality of depressed patterns 122a and 122b may be the same or substantially similar, and the width of the depressed pattern 122a and 122b adjacent to the center C of the back film 120 may be larger than the width of the depressed pattern 122a and 122b far from the center C of the back film 120. The widths of the plurality of depressed patterns 122a and 122b may decrease as the distance from the center C of the back film 120 increases.

In some example embodiments, as the distance from the center C of the back film 120 increases, the widths of the plurality of depresses patterns 122a and 122b may decrease and the spaces between the plurality of depressed patterns 122a and 122b may increase. The elongation at the center C of the back film 120 may be further increased, and this is more advantageous for bending or folding the flexible display device.

In some example embodiments, as illustrated in FIG. 3A, each of the plurality of depressed patterns 122a may have a straight line shape. The depressed patterns 122a, which are positioned at the same distance from the center C of the back film 120, may form a rectangle. In some example embodiments, the depressed patterns 122a forming the rectangle may be spaced apart from each other. In other example embodiments, the depressed patterns 122a forming the rectangle may be connected to each other.

In some example embodiments, as illustrated in FIG. 3B, each of the plurality of depressed patterns 122b may have a curved line shape. The depressed patterns 122b, which are positioned at the same distance from the center C of the back film 120, may form a circle. In some example embodiments, the depressed patterns 122b forming the circle may be spaced apart from each other. In other example embodiments, the depressed patterns 122b forming the circle may be connected to each other.

In some example embodiments, each of the plurality of depressed patterns 122a and 122b may include a plurality of separate parts and each of the plurality of depressed patterns 122a and 122b may include a plurality of dot patterns. In some example embodiments, the plurality of depressed patterns 122a and 122b may extend to edges of the back film 120.

Figure 4A:
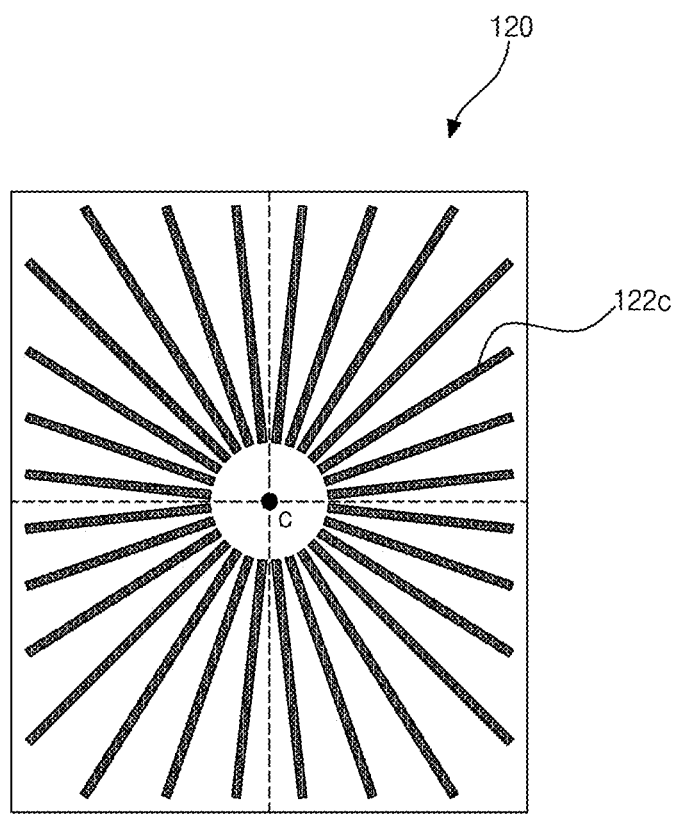
FIGS. 4A and 4B are plan views of a back film according to a second example embodiment of the present disclosure.
Figure 4B:
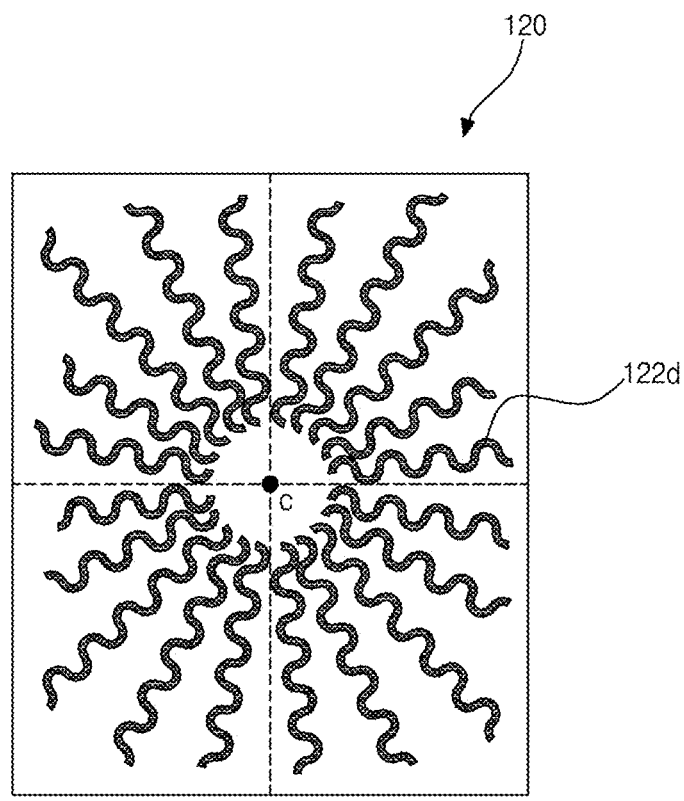

FIGS. 4A and 4B are plan views of a back film according to an example embodiment of the present disclosure.

As illustrated in FIGS. 4A and 4B, the back film 120 according to a second example embodiment of the present disclosure includes a plurality of depressed patterns 122c and 122d at a surface thereof.

As illustrated in FIGS. 4A and 4B, the plurality of depressed patterns 122c and 122d may extend in a direction away from a center C of the back film 120. In some example embodiments, the back film 120 may have a rectangular shape and lengths of the plurality of depressed patterns 122c and 122d may increase and then decrease along a clockwise direction or a counterclockwise direction. In other example embodiments, the back film 120 may have a circular shape and lengths of the plurality of depressed patterns 122c and 122d may be the same or substantially similar. The elongation of the back film 120 may be about 11% to 13%, and the modulus may be about 3.5 GPa to 3.8 GPa.

In some example embodiments, the plurality of depressed patterns 122c and 122d may have the same or substantially similar widths. In other example embodiments, spaces between the plurality of depressed patterns 122c and 122d may increase as a distance from the center C of the back film 120 increases. In other example embodiments, widths of the plurality of depressed patterns 122c and 122d may increase as the distance from the center C of the back film 120 increases. The space between the depressed patterns 122c and 122d may be the same or substantially similar.

As illustrated in FIG. 4A, each of the plurality of depressed patterns 122c may have a straight line shape. On the other hand, as illustrated in FIG. 4B, each of the plurality of depressed patterns 122d may have a curved line shape with a plurality of inflection points.

In some example embodiments, each of the plurality of depressed patterns 122c and 122d may include a plurality of separate parts and each of the plurality of depressed patterns 122c and 122d may include a plurality of dot patterns. In some example embodiments, the plurality of depressed patterns 122c and 122d may extend to edges of the back film 120.

Because the back film 120 according to example embodiments of the present disclosure may include the plurality of depressed patterns 122a, 122b, 122c and 122d, which are spaced apart from each other, it may be possible to implement a flexible display device which may be easily extended and contracted in various directions. Also, because the back film 120 according to example embodiments of the present disclosure may include the plurality of depressed patterns 122a, 122b, 122c and 122d, which extend in the direction away from the center C of the back film 120, it may be possible to implement a flexible display device which may be easily extended and contracted in various directions.

In some example embodiments, the back film 120 may have embossed patterns. Each embossed pattern may correspond to an area between adjacent depressed patterns 122a, 122b, 122c and 122d.

FIGS. 5A to 5E are cross-sectional views showing a flexible display device in steps for a method of fabricating the flexible display device according to example embodiments of the present disclosure.

Figure 5A:
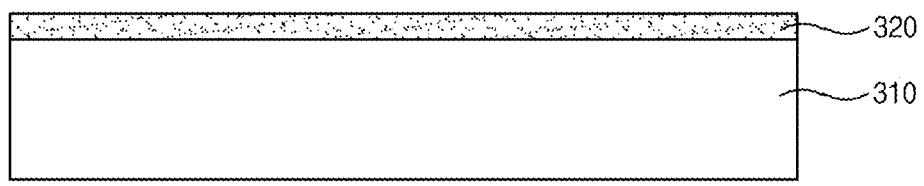
FIGS. 5A-5E are cross-sectional views showing a flexible display device in steps for a method of fabricating the same according to an example embodiment of the present disclosure.

As illustrated in FIG. 5A, a sacrificial layer 320 may be formed on a carrier substrate 310. The sacrificial layer 320, which may be an inorganic layer, may be formed through a deposition process. In some example embodiments, the sacrificial layer 320 may be formed of amorphous silicon and the carrier substrate 310 may be formed of glass, but are not limited thereto.

Figure 5B:
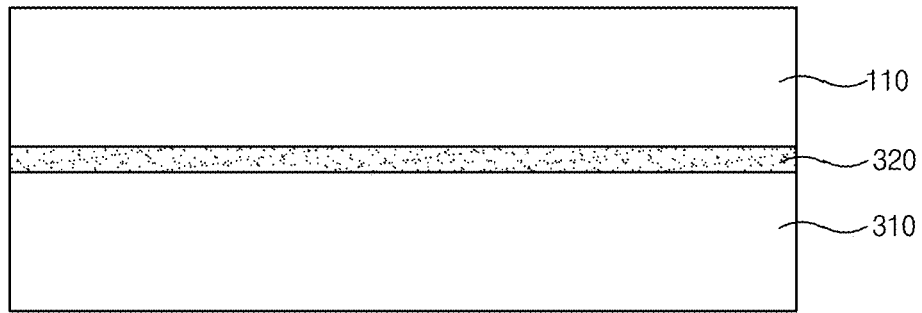

As illustrated in FIG. 5B, a flexible substrate (not shown in FIG. 5B) may be formed on the sacrificial layer 320, and an element layer (not shown in FIG. 5B) may be formed thereon, thereby fabricating a display panel 110. The element layer may include a thin film transistor and a light emitting diode or a liquid crystal capacitor connected to the thin film transistor.

Figure 5C:
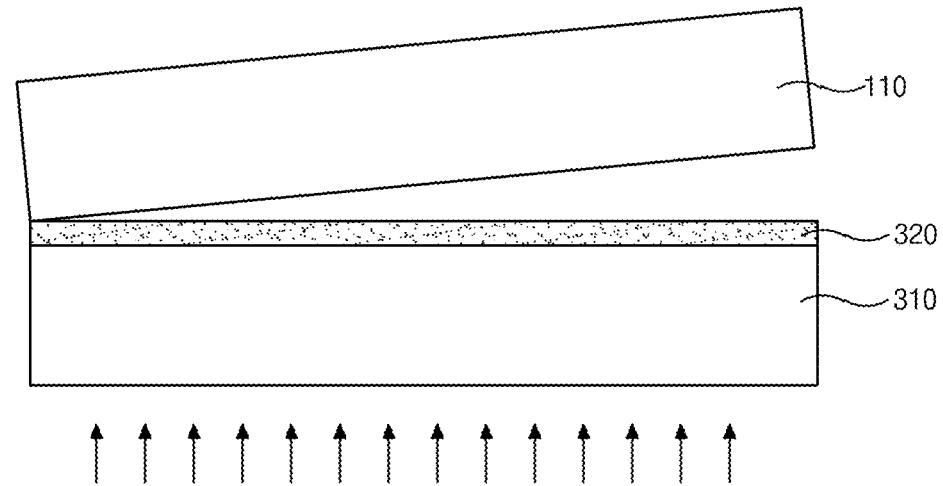

Then, as illustrated in FIG. 5C, a laser may be irradiated to the sacrificial layer 320 at a rear surface of the carrier substrate 310, and crystallinity of the sacrificial layer 320 may be changed. Therefore, the display panel 110 may be detached from the sacrificial layer 320 that is on the carrier substrate 310.

Figure 5D:
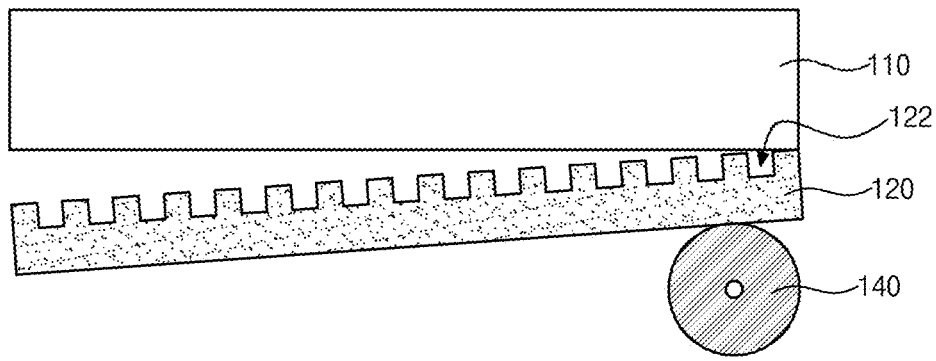

Next, as illustrated in FIG. 5D, a back film 120 may be disposed at a rear surface of the display panel 110 such that a plurality of depressed patterns 122 faces the flexible substrate of the display panel 110 and may be laminated by a means such as a roller 140. Accordingly, the back film 120 may be attached to the rear surface of the display panel 110.

Figure 5E:
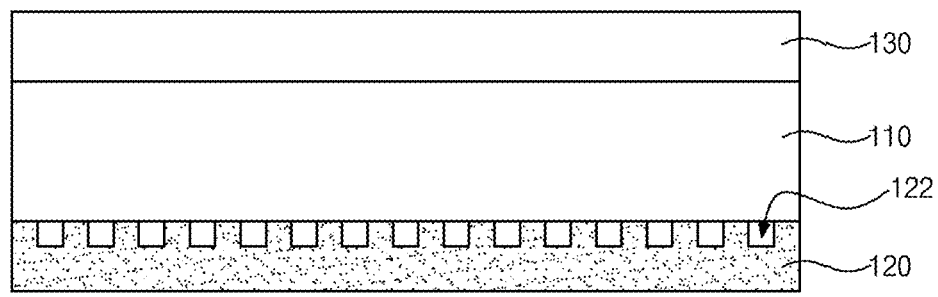

Then, as illustrated in FIG. 5E, a cover window 130 may be attached to a front surface of the display panel 110, thereby completing the flexible display device.

In the flexible display device according to example embodiments of the present disclosure, because the back film includes the plurality of depressed or embossed patterns, the elongation of the back film may be increased without lowering the modulus. Accordingly, the flexibility of the display device may be improved while maintaining the force of supporting the flexible substrate. In addition, because the depressed patterns are spaced apart from each other and/or extend in a direction away from the center of the back film, the flexible display device may be easily extended and/or contracted in various directions.

It will be apparent to those skilled in the art that various modifications and variations may be made in the flexible substrate and flexible display device of the present disclosure without departing from the technical idea or scope of the disclosure. Thus, it is intended that the present disclosure cover the modifications and variations of this disclosure, provided that they come within the scope of the appended claims and their equivalents.

What is claimed is:

1. A flexible display device, comprising:
a flexible display panel configured to display an image; and
a back film under the display panel,
wherein the back film includes a plurality of depressed patterns at a surface adjacent to the display panel,
wherein the plurality of depressed patterns are spaced apart from each other and extend in a direction away from a center of the back film,
wherein the back film has an elongation of 6% to 15% and a modulus of 3.5 GPa to 3.9 GPa, and
wherein each of the plurality of depressed patterns has a rectangular or square cross section, and widths of the plurality of depressed patterns gradually decrease as a distance from the center of the back film increases in a plan view; and
a total area of portions of the back film contacting the display panel is 50% to 70% of a total overlapping area between the back film and the display panel in the plan view.

2. The flexible display device of claim 1, wherein each of the plurality of depressed patterns has a straight line shape.

3. The flexible display device of claim 2, wherein the plurality of depressed patterns are positioned at a distance from the center of the back film such that the plurality of depressed patterns form a rectangle.

4. The flexible display device of claim 2, wherein spaces between the plurality of depressed patterns increase as a distance from the center of the back film increases.

5. The flexible display device of claim 1, wherein each of the plurality of depressed patterns has a curved line shape.

6. The flexible display device of claim 5, wherein the plurality of depressed patterns are positioned at a distance from the center of the back film such that the plurality of depressed patterns form a circle.

7. The flexible display device of claim 5, wherein spaces between the plurality of depressed patterns increase with a distance from the center of the back film.

8. The flexible display device of claim 1, wherein a depth of each of the plurality of depressed patterns is 0.4 to 0.6 times a thickness of the back film.

9. The flexible display device of claim 1, wherein the back film is formed of polyethylene terephthalate (PET), polyethylene naphthalate (PEN), cyclic olefin copolymer (COC), or polyamide-imide (PAI).

* * * * *